United States Patent
Rapoport

[11] Patent Number: 5,978,694
[45] Date of Patent: Nov. 2, 1999

[54] METHOD AND APPARATUS FOR DETECTING A MAGNETICALLY RESPONSIVE SUBSTANCE

[75] Inventor: Uri Rapoport, 17, Moshav Ben-Shemen, Israel, 73115

[73] Assignee: Uri Rapoport, Moshav Ben-Shemen, Israel

[21] Appl. No.: 08/807,256

[22] Filed: Feb. 27, 1997

[51] Int. Cl.[6] ........................................ A61B 5/00
[52] U.S. Cl. ............................ 600/407; 324/693; 436/63; 436/74; 600/309
[58] Field of Search .................................. 600/407, 409, 600/310, 309, 322, 410, 323, 420; 324/321, 306, 319, 308, 260, 317, 693; 436/63, 73, 74

[56] References Cited

U.S. PATENT DOCUMENTS

| | | |
|---|---|---|
| 3,735,247 | 5/1973 | Harker . |
| 3,809,070 | 5/1974 | Doll et al. . |
| 4,531,093 | 7/1985 | Rollwitz et al. . |
| 4,564,811 | 1/1986 | Walker et al. . |
| 4,638,251 | 1/1987 | King . |
| 4,701,705 | 10/1987 | Rollwitz . |
| 4,875,486 | 10/1989 | Rapoport et al. . |
| 4,969,469 | 11/1990 | Mills . |
| 4,998,976 | 3/1991 | Rapoport . |
| 5,072,732 | 12/1991 | Rapoport et al. . |
| 5,073,858 | 12/1991 | Mills . |
| 5,159,929 | 11/1992 | Morris et al. . |
| 5,179,346 | 1/1993 | McGee et al. . |
| 5,184,078 | 2/1993 | Rapoport . |
| 5,203,332 | 4/1993 | Leunbach . |
| 5,263,482 | 11/1993 | Leunbach . |
| 5,285,385 | 2/1994 | Igarashi et al. . |
| 5,305,751 | 4/1994 | Chopp et al. . |
| 5,320,103 | 6/1994 | Rapoport et al. . |
| 5,322,065 | 6/1994 | Leunbach . |
| 5,343,150 | 8/1994 | Nakahata et al. . |
| 5,351,687 | 10/1994 | Kroll et al. . |
| 5,371,464 | 12/1994 | Rapoport . |
| 5,462,054 | 10/1995 | Rapoport et al. . |
| 5,494,030 | 2/1996 | Swartz et al. . |
| 5,594,849 | 1/1997 | Kuc et al. . |
| 5,628,309 | 5/1997 | Brown . |
| 5,752,514 | 5/1998 | Okamura et al. . |

FOREIGN PATENT DOCUMENTS

WO 9218993  10/1992  WIPO .

OTHER PUBLICATIONS

Shoemaker, et al., Experiments in Physical Chemistry, Third Ed., 1974, McGraw–Hill Book Company, pp. 422–434.

Cotton and Wilkinson, Advanced Inorganic Chemistry, Third Ed., 1972, Interscience Publishers, pp. 536–546.

*Primary Examiner*—George Manuel
*Assistant Examiner*—Shawna J Shaw
*Attorney, Agent, or Firm*—Jones, Day, Reavis & Pogue

[57] ABSTRACT

Method and apparatus for detecting in a sample a substance which responds to an applied magnetic field, such as a paramagnetic substance. The sample is placed in an applied magnetic field, and the effect of the sample on a performance characteristic of an electrical conductor is correlated to the presence of the substance. The method and apparatus may be adapted for qualitative and quantitative determination.

53 Claims, 4 Drawing Sheets

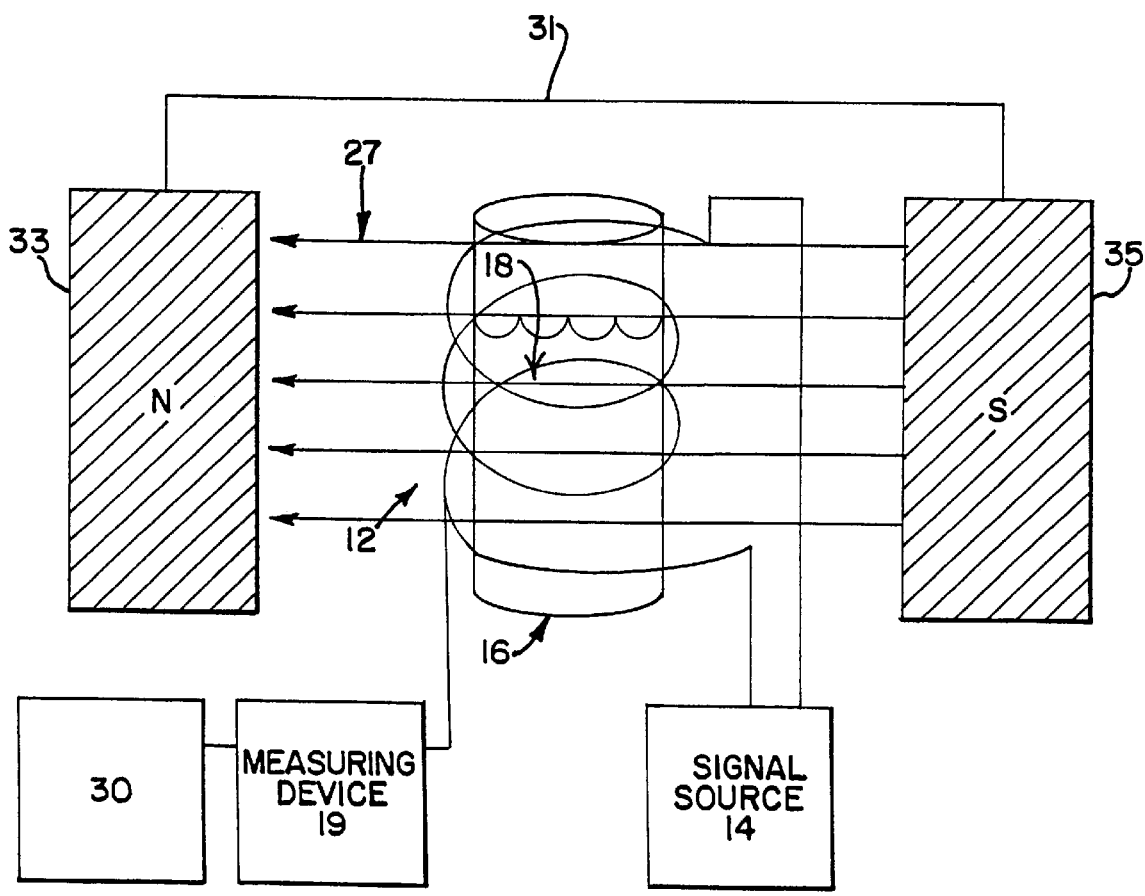

METHOD AND APPARATUS FOR DETECTING A MAGNETICALLY RESPONSIVE SUBSTANCE

FIELD OF THE INVENTION

This invention relates to methods and apparatus for detecting the presence of a substance in a sample by determining the response of the sample to an applied magnetic field. More particularly, this invention relates to practical applications for methods and apparatus for detecting the presence of a substance in a sample by determining the response of the sample to an applied magnetic field, to ascertain useful information about the chemical and physical behavior of the sample.

BACKGROUND OF THE INVENTION

The magnetic properties of chemical substances have been studied extensively. Several types of magnetism are known, including paramagnetism, diamagnetism, and ferromagnetism. A discussion of these magnetic properties is found in Cotton and Wilkinson, *Advanced Inorganic Chemistry*, Third Ed., 1972, Interscience Publishers, pp. 535–546, the disclosure of which is incorporated herein by reference in its entirety.

A paramagnetic substance is one which is attracted into a magnetic field with a force proportional to the field strength times the field gradient. Paramagnetism is generally caused by the presence in the substance of ions, atoms or molecules having unpaired electrons. Each of these has a definite paramagnetic moment that exists in the absence of an applied magnetic field.

A diamagnetic substance is one which is repelled by a magnetic field. Diamagnetic behavior is due to small magnetic moments induced by an applied magnetic field in opposition to the field. These induced moments do not exist in the absence of the field. All material is diamagnetic to some extent, but the effect is very small and is often masked by the paramagnetic or ferromagnetic effects if the individual molecules have permanent magnetic dipole moments.

A ferromagnetic substance is one which exhibits high magnetic permeability and the ability to acquire magnetization in relatively weak fields, such as iron, nickel, and cobalt.

Magnetic susceptibility is a measurable property of a substance that allows the determination of the magnetic moment of that substance. Magnetic susceptibility is defined as the ratio of the magnetic permeability of a substance to that of a vacuum, minus one. Magnetic susceptibility is positive for paramagnetic and ferromagnetic substances, and negative for diamagnetic substances.

Magnetic permeability is a measure of the ability of a substance to modify a magnetic field, and is equal to the ratio of magnetic induction to magnetic intensity.

Magnetic induction is a vector quantity that specifies the direction and magnitude of magnetic force at every point in a magnetic field.

Magnetic intensity is that part of a magnetic field related solely to external currents as a cause, without reference to the presence of matter.

Magnetic moment is the ratio of the maximum torque exerted on a magnet or electric current loop in a magnetic field to the magnetic induction of the field. Magnetic moment can be calculated from magnetic susceptibility.

Many methods are known for measuring magnetic susceptibility, all of which depend on measuring the force exerted upon a sample when it is placed in an inhomogeneous magnetic field. The more paramagnetic the sample is, the more strongly it will be drawn toward the more intense part of the field; the more diamagnetic the sample is, the more it will be repelled into the weakest part.

A typical prior art method of measuring magnetic susceptibility of a sample involves an apparatus known as a Gouy balance. This apparatus and the method of its use are described in standard texts such as Shoemaker, et al., *Experiments in Physical Chemistry*, Third Ed., 1974, McGraw-Hill Book Company, pp. 422–434, the disclosure of which is incorporated herein by reference. As disclosed in that reference, such an apparatus can be delicate, expensive, and complex.

It would be desirable to have a method and apparatus to measure quantitative and qualitative changes in the magnetic susceptibility of a sample that avoid the disadvantages of the prior art.

It is thus one object of the invention to provide a simple, relatively inexpensive method and apparatus for determining quantitative and qualitative changes in the magnetic susceptibility of a sample.

It is another object of the invention to provide such a method and apparatus that are adaptable for use in an industrial environment.

It is yet another object of the invention to provide such a method and apparatus that are adaptable for use in non-invasive biomedical applications.

It is still another object of the invention to provide such a method and apparatus that are adaptable for use in non-invasive biomedical applications in a clinical environment.

Other objects of the invention will become apparent from the following description and drawings and the appended claims.

SUMMARY OF THE INVENTION

A method and apparatus are disclosed for detecting the presence of a substance in a sample by determining the response of the sample to an applied magnetic field. The apparatus comprises a first electrical conductor, a magnet assembly disposed in operative relation to said first electrical conductor, a first means for measuring one or more selected observable performance characteristics of said first electrical conductor, and a means for signaling or displaying the result of that measurement. In certain applications, the inventive apparatus can also include means for storing and analyzing the data obtained as input from said first measuring means. Depending on the particular application, the apparatus can further comprise a second electrical conductor and a second means for measuring one or more selected observable performance characteristics of said second electrical conductor, which second measuring means can also provide input to said means for data storage and analysis.

In accordance with the inventive method, a sample under consideration is placed in operative relationship to said first conductor so as to affect a performance characteristic of said first electrical conductor. The sample is also subject to the applied magnetic field of the magnet assembly. The effect of the sample, subject to the applied magnetic field, on a performance characteristic of said first electrical conductor is measured by said first measuring means, and the value is displayed, and/or optionally inputted to said data storage and analysis means. Subsequent measurements of this same performance characteristic of said first electrical conductor are made over time, either continuously or at pre-determined intervals. If the sample is undergoing a chemical reaction or physical change which causes a change in the total magnetic susceptibility of the sample so as to alter the response of the sample to the applied magnetic field, there will be a change in the effect of the sample on the measured performance characteristic of the first conductor. This measured change can then be correlated to the chemical reaction or physical change over time in the sample.

In an alternative application, the inventive method and apparatus can be used to monitor changes in the composition of a fluid moving through a conduit, such as a pipe in an industrial environment. In this application, the first electrical conductor and the magnet assembly are positioned in operative relation to a portion of the conduit, and measurements are made of a performance characteristic of the electrical conductor. Changes in the value of the performance characteristic as measured by the first measuring means will indicate a change in the composition of the fluid flowing through the conduit, and in particular a change in the amount of a substance in the fluid having a measurable response to an applied magnetic field. The inventive method and apparatus can thus be used for non-invasive and non-destructive monitoring of the composition of a fluid in a conduit.

In an alternative embodiment of the invention, it may be desirable to compare the effect of the sample on the conductor in the presence of the applied magnetic field with the effect of the sample on the conductor in the absence of the applied magnetic field. One way to accomplish this is to use an electromagnet for the magnet assembly, so that the magnetic field can be switched on and off. The performance characteristic of the first conductor in the presence of the sample can be measured with the field turned off and then with the field turned on, and the two values compared.

Another way to obtain these two measurements is to provide a second electrical conductor, along with a second means for measuring one or more selected observable performance characteristics of said second electrical conductor. Ideally, the first and second electrical conductors are electrically identical, i.e., have identical performance characteristics of resistance, conductance, capacitance, inductance, efficiency (Q) and the like. Alternatively, the differences in the performance characteristics of the first and second electrical conductors are pre-determined, such that subsequent electrical measurements made in the course of the inventive method can be calibrated to account for the differences. In this embodiment, the second electrical conductor is not subject to an applied magnetic field. The sample under consideration is placed in operative relationship to said second conductor, which is not subject to the magnetic field of the magnet assembly, and the effect of the sample on the performance characteristic of said second electrical conductor is measured. The two measurements are compared, taking into consideration the calibrations necessary to account for the differences, if any, in the performance characteristic of said first and second conductors. The corrected difference between the two measurements is then a function solely of the presence of a substance in the sample which responds to the applied magnetic field. It is thus possible to determine both qualitatively and quantitatively the presence in the sample of substances which respond to the applied magnetic field.

The inventive method and apparatus have wide utility in both the medical and industrial arts, and particularly in non-invasive medical applications, as will be understood from the following detailed description of the invention.

BRIEF DESCRIPTION OF THE DRAWINGS

FIG. 1 schematically illustrates an embodiment of the inventive apparatus and method configured to monitor over time the progress of a reaction taking place in a sample container.

DETAILED DESCRIPTION OF THE INVENTION

Figure 2A:
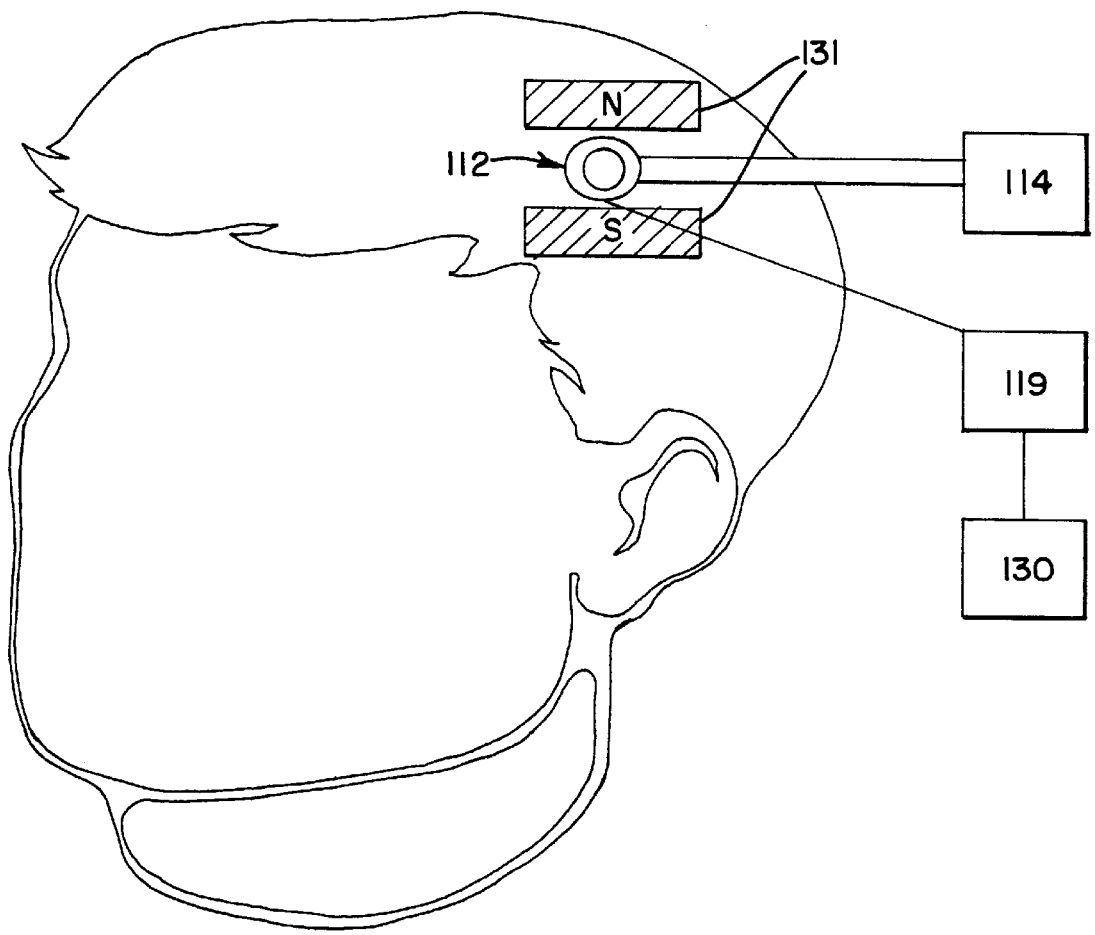
FIG. 2A schematically illustrates an alternative embodiment of the inventive apparatus and method, adapted for the situation wherein the sample under consideration is human blood measured in vivo in a selected region of a human brain.

In accordance with the invention, a first electrical conductor is provided. Depending on the particular application intended for the device, the first electrical conductor may be in any desired configuration such as a coil, a wire, or a plate. A performance characteristic of the first electrical conductor is measured by known techniques. For purposes of this patent, the phrase "performance characteristics" of a conductor is intended to include, without limitation, such properties as resistance, conductance, inductance, capacitance, and efficiency (Q).

The inventive apparatus further includes means for applying a known electromagnetic signal to said first electrical conductor. "Electromagnetic signal" as used in this patent is intended to include without limitation electromagnetic waves of any frequency; and electrical current, either AC or DC. The electromagnetic signal applied to the first conductor is not intended to induce any physical or chemical change in the sample under consideration, but is intended only to provide a phenomenon, the change in which can be measured to indicate the presence in the sample of the substance sought to be detected.

The first electrical conductor is disposed in operative relation to a magnet assembly which applies a known magnetic field to the sample. As used in the context of this patent, "in operative relation" means that the magnet assembly is positioned to apply a magnetic field to the sample under consideration. The magnet assembly preferably will be positioned to apply the magnetic field in a direction relative to the orientation of the sample to optimize the effect of the substance of interest in the sample on the selected performance characteristic of the first electrical conductor. The chosen direction can be fixed or variable. The intensity and the gradient of the applied magnetic field can also be fixed or variable, depending on the particular application of the invention.

In the embodiment illustrated schematically in FIG. 1, first conductor 12 is configured as a coil, and electromagnetic signal source 14 is a current source which applies a current to first conductor 12.

Conductor 12 is configured so that sample holder 16 can be placed in operative relation thereto, i.e., so that a sample 18 in sample holder 16 can have a measurable effect on the performance of conductor 12. Measuring device 19 measures the value of a pre-selected performance characteristic of coil 12. Depending on the performance characteristic of conductor 12 being measured, measuring device 19 can be a voltmeter, a potentiometer, an ammeter, or other known device. The value measured by measuring device 19 may be displayed digitally on the device itself or on an associated display device such as a chart or strip recorder or an oscilloscope, or indicated as an audible signal, or the value can be delivered as input to computer 30.

It will be appreciated that such measuring devices and display devices may also be used in the other embodiments described hereinafter.

Referring again to FIG. 1, first electrical conductor 12 is positioned in operative relation to a magnet assembly 31, which can be either an electromagnet or a permanent magnet assembly having opposed north and south pole pieces 33 and 35. As used in this context, "operative relation" means that the magnet assembly 31 is positioned to apply a magnetic field as generally represented by flux lines 27 to sample 18 in sample holder 16. If sample 18 in sample holder 16 contains a substance that responds to the applied magnetic field, for example a paramagnetic material such as iron in solution, then that responsive substance will be polarized by the applied magnetic field and will alter the performance characteristics of first conductor 12, as measured by measuring device 19. The optional computer 30 can be programmed to receive data from measuring device 19 on the performance characteristics of first conductor 12 over a period of time, either continuously or at pre-determined intervals. Changes in the value of the performance characteristic can be correlated to changes in the amount of substance in the sample responsive to the magnetic field.

In this manner, the inventive method and apparatus can be used to monitor the progress of a chemical reaction or physical change in sample 18. For example, the invention can be used to monitor the physical changes that occur in the hardening of a resin, if the resin contains a substance such as a paramagnetic material, the polarization response of which to an applied magnetic field changes as the resin changes from a liquid state to a solid state. Similarly, the invention can be used to monitor the progress of a chemical reaction if the reaction either produces or consumes a substance measurably responsive to the applied magnetic field. For example, if a chemical reaction either produces or consumes a paramagnetic ion, then the change in the concentration of that paramagnetic ion as the reaction proceeds will cause a change in the total magnetic susceptibility of the sample in the container, and thereby cause a change in the performance characteristic of first conductor 12 as measured by measuring device 19. Even if the reaction under direct study does not produce or consume a paramagnetic ion, the sample can be "spiked," either with a paramagnetic ion that is consumed by one of the reaction products, or with a substance that reacts with one of the reaction products to produce a paramagnetic ion. In this way, the production or consumption of paramagnetic ion will cause a change in total magnetic susceptibility of the sample 18, measurable as a change in a performance characteristic of first conductor 12, to allow indirect monitoring of the principal chemical reaction under consideration.

The inventive method and apparatus substantially as shown in FIG. 1 can also be used for non-invasive medical applications, such as the determination of a patient's metabolism. It is known that the total magnetic moment of a sample of blood, and thus the total measurable magnetic susceptibility of a sample, will change as a function of the level of oxygen bound to hemoglobin in the bloodstream. For example, to measure a patient's metabolism, the first conductor 12 can be a coil so sized as to accommodate a patient's finger, such that the finger serves as sample container 16 and the patient's in vivo blood is the sample 18. An initial measurement is taken under polarizing conditions, i.e., with a coil subject to an applied magnetic field as described above; the patient's finger is allowed to remain in operative relation to the conductor 12 and magnet assembly 31, and measurements by measurement device 19 of changes in the performance characteristic of conductor 12 are taken either continuously or at intervals over time. The measured values can be transmitted to an output device such as a strip recorder, or the values can be transmitted to computer 30. During this time, the patient can either be resting, or exercising under controlled conditions, such as on a treadmill. Changes in the measured value of the performance characteristic of the conductor 12 over time will be a function of the change in the average magnetic susceptibility of the patient's blood, which will be a function of the oxygen/hemoglobin interaction in the blood, and therefore will be an indication of the patient's metabolism.

Different configurations of the inventive apparatus can be used for other biomedical applications. FIG. 2A schematically illustrates an embodiment of the invention, not necessarily to scale, wherein electrical conductor 112 is configured as a flat antenna loop. As in FIG. 1, conductor 112 is connected to an electromagnetic signal source 114. Antenna loop 112 is operatively connected to a measuring device 119 which measures a preselected performance characteristic such as resistance, capacitance, conductance, inductance, or efficiency (Q) and inputs the data to computer 130. A magnet assembly 131 is positioned to provide an applied magnetic field as indicated by flux lines 127 to a pre-determined region of the brain, as shown in FIG. 2B.

As shown in FIG. 2A, conductor 112 is placed, for example, against the patient's head. It is known that the level of oxygen, a known paramagnetic substance, will vary in the brain at different locations as a result of the use of different brain cells. When generally configured and positioned in appropriate operative relation as shown in FIGS. 2A, 2B, the method and apparatus of the instant invention can be used to determine the oxygen level in different specific areas of the brain by measuring the change in magnetic susceptibility of those areas over time, by comparing the changes in the measured performance values of conductor 112 as measured by measuring device 119 and calculated by computer 130.

Figure 2B:
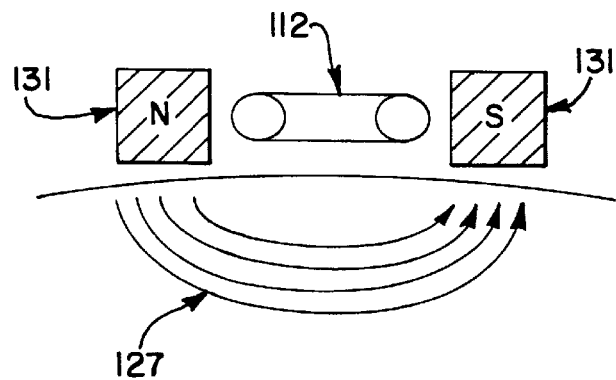
FIG. 2B is a cross-sectional view of a portion of the embodiment shown in FIG. 2A, and indicating with flux lines the presence of the magnetic field.

When used as shown in FIGS. 2A, 2B to measure changes in oxygen level in different areas of the brain during different activities, the inventive method and apparatus can be used in conjunction with known tomographic techniques to "map" the brain, i.e., to identify different areas of the brain with different types of activities. Those skilled in the art will recognize that such mapping techniques could involve varying the magnetic field intensity as a function of time; using an inhomogeneous field of known gradient; varying the axis of the magnetic field with respect to the site of the brain being studied; and applying more than one magnetic field directed along different intersecting axes to achieve a certain magnetic field strength at the region of intersection in the brain. Those skilled in the art will further recognize that these mapping techniques are applicable not only to the brain, but similarly can be used to map the metabolism of other organs of the body, non-invasively. For example, the method and apparatus could be adapted to map metabolism and/or flow of blood in the heart or other organs.

Figure 3:
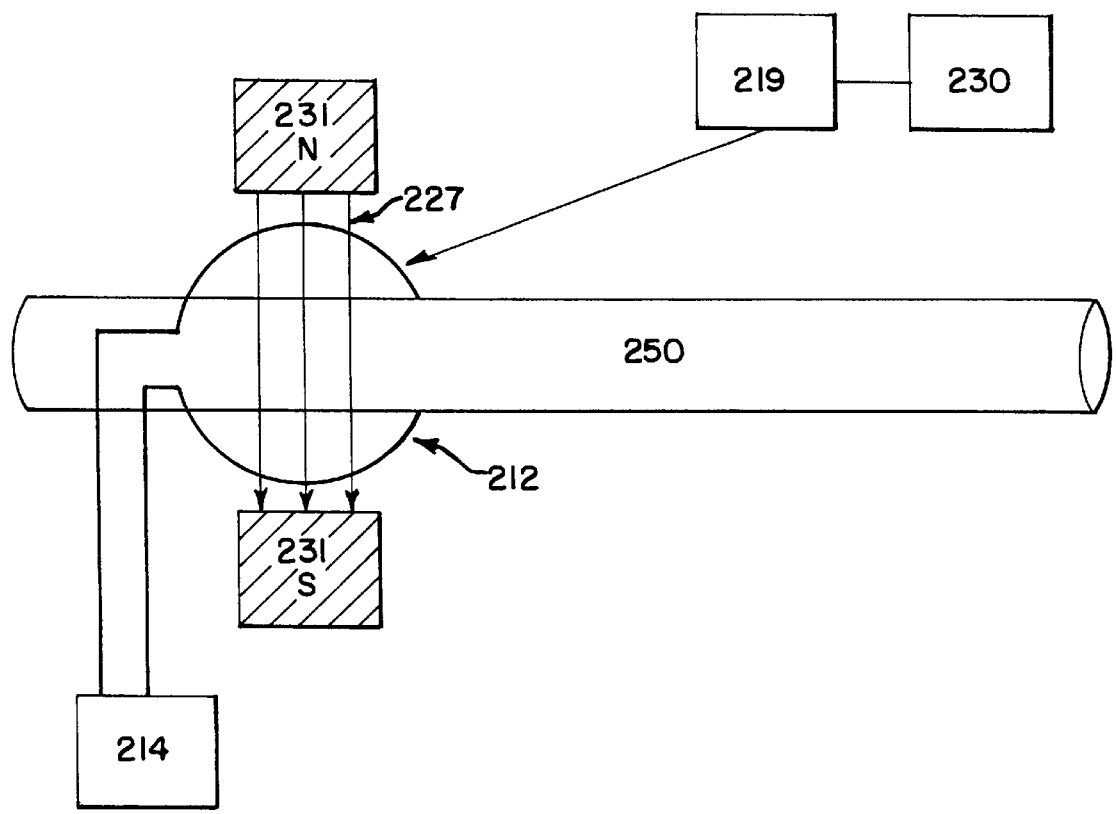
FIG. 3 schematically illustrates yet another alternative embodiment of the inventive apparatus and method, adapted for the situation in which the sample under consideration is a quantity of material flowing through a conduit.

FIG. 3 schematically illustrates another embodiment of the inventive method and apparatus useful in industrial settings. First conductor 212 may be configured as an antenna loop, or may be any other suitable shape. An electromagnetic signal is applied from signal source 214 to first conductor 212. Conductor 212 is associated with a corresponding measuring device 219 for measuring a selected performance characteristic, and, where desired, inputting the data to an optional computer, 230. Electrical conductor 212 is disposed in operative relation to a conduit 250, through which flows a fluid. A magnet assembly 231, shown for illustrative purposes as a two-piece permanent magnet assembly, is positioned to apply a magnetic field to the portion of the conduit in operative relation to conductor 212, as indicated by flux lines 227.

The embodiment shown in FIG. 3 can be used to detect a change in the composition of the fluid in the conduit at any point in time, as long as the change in composition causes a measurable change in the magnetic susceptibility of the fluid. For example, if the fluid in the conduit were to become contaminated by a paramagnetic ions in solution, or even by ferromagnetic particles in suspension, the resultant change in the magnetic moment of the fluid, and thus of the measurable average magnetic susceptibility, relative to that of the uncontaminated fluid, would cause a change in the performance characteristic of conductor 212 as measured by device 219 and monitored by computer 230. In some situations, computer 230 may be unnecessary, and measuring device 219 can be connected to a display device such as a digital read-out, a chart recorder, or a strip recorder, or to a monitoring device which produces an audible or visual alarm if the value measured by device 219 falls outside a pre-determined acceptable range. Thus, contamination of an industrial process can be monitored non-invasively and non-destructively.

In addition to industrial settings, the embodiment shown in FIG. 3 can also be used in certain medical applications. Instead of representing a pipe carrying an industrial fluid, conduit 250 could be a tube through which blood flows during a medical procedure, such as in a heart/lung machine during surgery or in a dialysis machine during dialysis treatments. The inventive method and apparatus could be used during these procedures to monitor the level in the blood of oxygen or other substances responsive to an applied magnetic field.

The method and apparatus of the instant invention can also be used to determine the structure of certain crystals. It is known that different crystal structures will have different polarization effects. Therefore, measurements of relative magnetic susceptibilities of a crystal sample as generally described above, varying either the axis of the magnetic field relative to the sample, or the orientation of the sample relative to the applied magnetic field, can give information about the crystal polarization when the crystal is subject to an applied magnetic field, and therefore information about the crystal structure.

While the foregoing description of embodiments and applications of the method and apparatus have described qualitative analyses based on relative measurements of a sample over a period of time, or of a variable sample as it passes through a conduit over a period of time, in yet another embodiment the inventive method and apparatus may be used for the quantitative determination in a sample of substances that respond to an applied magnetic field.

In an embodiment suited for quantitative analysis, the effect of the sample on an electrical conductor in the presence of a magnetic field is compared with the effect of the sample on the electrical conductor in the absence of the magnetic field. Referring to FIG. 1, if magnet assembly 31 is an electromagnet, this can be accomplished simply by taking a measurement from measuring device 19 with magnet assembly 31 turned off, and then taking a measurement when magnet assembly 31 is turned on, and comparing the two measurements. The difference between the two measurements will be due solely to the response of the sample to the applied magnetic field, and can be quantitatively correlated to the amount of substance to be detected in the sample. For embodiments wherein magnet assembly 31 is a permanent magnet assembly, the inventive apparatus may further comprise a second electrical conductor. Ideally, the second electrical conductor will be of identical configuration and have identical performance characteristics as said first electrical conductor. As a practical matter, it is recognized that the performance characteristics of said first and second electrical conductors may not be precisely identical. One or more performance characteristics of the first and second electrical conductors are measured, and the values are stored in an appropriate data storage means, such as a computer. This allows for normalization and calibration of the measured response of the sample. Also provided in this embodiment are means for applying a known electromagnetic signal to said second electrical conductor. There is also a measuring means for measuring the performance of the second electrical conductor, and providing the measured value to a display device or preferably to a computer. Unlike the first electrical conductor, the second electrical conductor has no associated magnet assembly and is not subject to an applied magnetic field.

Figure 4:
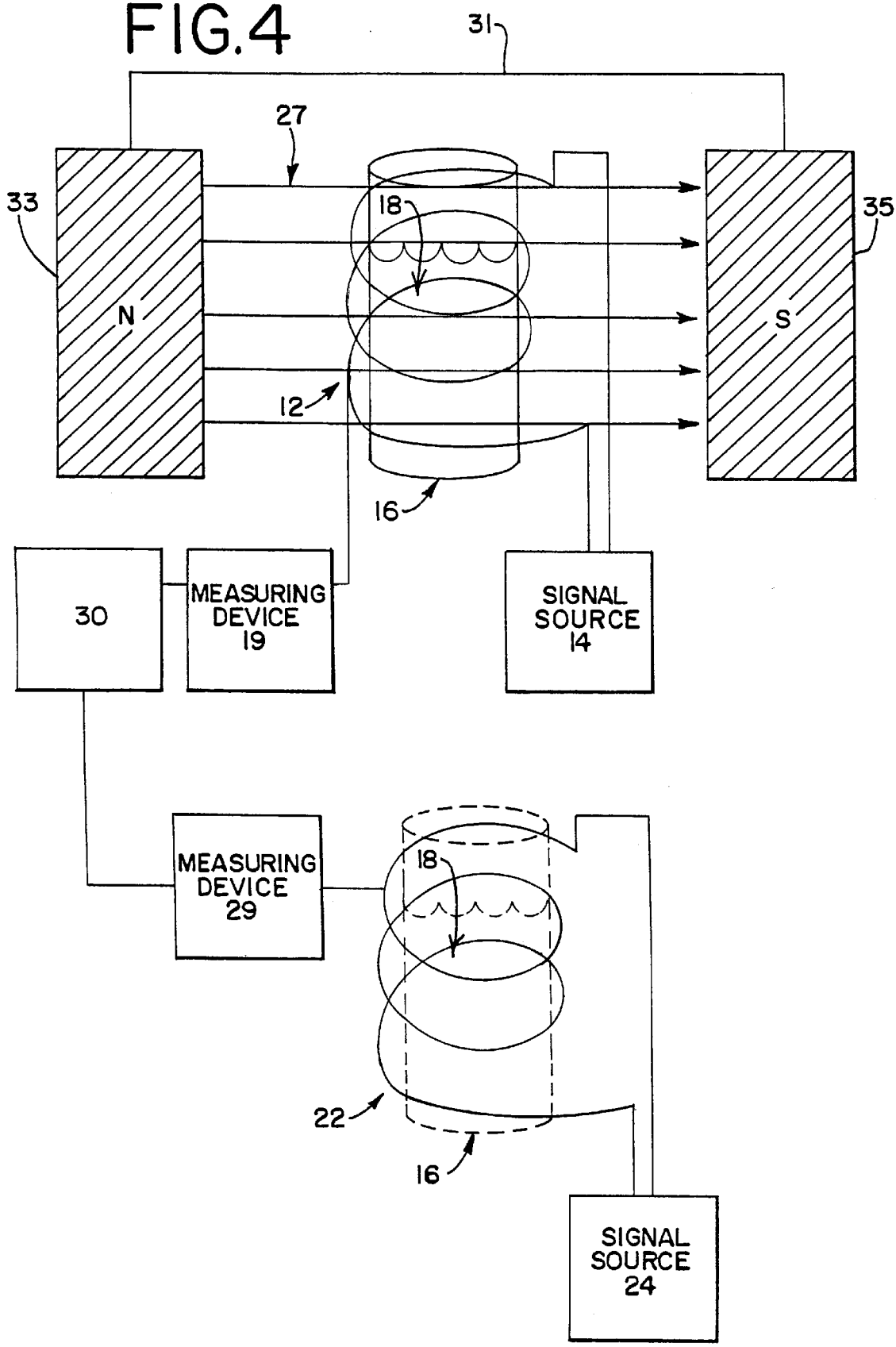
FIG. 4 schematically illustrates an embodiment of the invention using a second electrical conductor and being suitable for quantitative analysis.

An example of this embodiment of the instant invention is illustrated schematically in FIG. 4. This illustration contains all of the elements of FIG. 1, and like reference numerals indicate like elements of the invention. In addition, second electrical conductor 22 is provided with an electromagnetic signal source 24, and a measuring device 29 which measures a performance characteristic of electrical conductor 22 and transmits the data to computer 30. It will be recognized that in other embodiments a single signal source could be used to supply an electromagnetic signal to each conductor and a single measuring device could also be used to measure the performance characteristic of each conductor. Ideally, conductors 12 and 22 have identical electrical performance characteristics of resistance, capacitance, conductance, inductance, efficiency (Q), and the like. As a practical matter, the performance characteristics of each of the conductors 12 and 22 can be predetermined and the data stored in a computer 30.

The following illustrates the quantitative method of the instant invention. For example, if sample holder 16 is a test tube and sample 18 is a standard solution of a non-paramagnetic electrolyte, and if sample holder 16 is placed axially within the coil of electrical conductor 22 as shown by dotted image in FIG. 4, then when an electromagnetic signal is applied from signal source 24 to electrical conductor 22, the performance of conductor 22, as determined by measuring device 29, will be different from the value observed in the absence of the sample. This information can be stored in computer 30. If the sample in sample holder 16 is then replaced with a sample of a solution having a non-zero permanent magnetic moment, such as a ferrous solution, this sample will have a different effect on the performance of electrical conductor 22. The difference in the value of the selected performance characteristic of conductor 22, as measured by measuring device 29 and also stored in computer 30, will be a function of the magnetic susceptibility of the solution. It is possible to prepare a series of ferrous solutions of known concentrations and measure the effect of each sample solution on the performance of electrical conductor 22. From this data it is possible to construct a calibration curve describing the effect of ferrous ion concentration on the performance of conductor 22 in the absence of an applied magnetic field.

The sample being tested is then placed in the coil of first conductor 12, subject to the applied magnetic field from magnet assembly 31, and the response of conductor 12 is measured by device 19 and inputted to computer 30. The computer 30 can then determine the difference between the performance of the conductor 12 with the sample in the presence of the magnetic field, and the performance of the conductor 22 with the sample in the absence of the magnetic field. The difference between the two values, corrected for inherent differences in the performance values of the two conductors, will be a function of the magnetic susceptibility of the sample. By subtracting out the effects not due to the applied magnetic field, it is possible to determine the quantity of material in the sample responsive to the applied magnetic field.

The apparatus and method of the instant invention can be used for non-invasive medical testing. For example, electrical conductors 12 and 22 each can be coils configured to receive a human finger, such that the finger is the "sample holder" 16 and the patient's blood within the finger is the sample 18. The patient places his finger in a device having a first receptacle which serves to position the finger in coil 22. Any changes observed in the performance of the coil 22 will be due to the iron, salts, and water i.e., both the paramagnetic and non-paramagnetic substances in the patient's blood. The change in a performance characteristic of coil 22 is measured by measuring device 29 and the value is stored in computer 30. The patient then places his finger in a different receptacle of the device, which serves to position the finger in a coil 12 which is subject to an applied magnetic field from magnet assembly 31. The sodium ions and other salts will not be polarized; only iron present in the blood will be polarized, and the magnetic susceptibility of the polarized iron will cause a different value for the performance characteristic of coil 12. Thus, the difference between the performance values of coils 12 and 22 (after correction for inherent differences in the coils themselves) will be due to the presence of the iron in the blood. Thus, the invention provides a simple, non-invasive means of testing for anemia, or other conditions relating to the presence of iron in the bloodstream.

It will be understood that this embodiment of the invention, wherein a quantitative determination can be made by taking the difference between signals generated in the presence and absence of an applied magnetic field, can also be used in conjunction with the organ mapping techniques illustrated in FIG. 2 and described herein.

In the practice of this alternative method and apparatus, and regardless of whether the magnet assembly is an electromagnetic or a permanent magnet assembly, it generally will be preferred to take the measurement in the absence of the magnetic field before taking the measurement in the presence of the magnetic field; otherwise, magnetic moment relaxation effects induced in the sample by application of a magnetic field could distort a subsequent measurement taken in the absence of the applied field.

This alternative embodiment can also be used for quantitative measurements in industrial and biomedical applications such as shown and described in connection with FIG. 3. For this use, the conductor without the applied magnetic field will be placed upstream of the conductor with the applied magnetic field. A magnetic susceptibility measurement, i.e., as determined from a change in conductor performance, is made first at the upstream conductor, and then at the downstream conductor. The time interval between the two measurements is determined by the distance between the two conductors along the conduit and the velocity of the fluid within the conduit, so that the two measurements are actually made on the same sample of fluid as it moves through the conduit. The timing of the two measurements, and the comparison of the measured magnetic susceptibilities, can all be performed by computer 230.

The magnet assembly 31, 131, 231 as disclosed herein is preferably very small but capable of creating relatively large magnetic fields. The magnet assembly can be either an electromagnet or a permanent magnet assembly. Such permanent magnet assemblies are disclosed, for example, in U.S. Pat. No. 4,998,976, U.S. Pat. No. 5,320,103, U.S. Pat. No. 5,462,054 and PCT EP 91/00716 international publication number WO 92/18993, all of which are incorporated herein by reference in their entirety. The larger the applied magnetic field, the more sensitive the entire apparatus will be. Thus, with a sufficiently strong magnet assembly, it is possible to measure the magnetic susceptibility of magnetically responsive substances even in a very dilute sample, such as a dilute aqueous solution of paramagnetic ferrous ions, in which the overall sample is diamagnetic.

The foregoing descriptions of certain preferred embodiments of the inventive apparatus and method are intended by way of illustration and not by way of limitation. Other variations and applications of the instant invention will be apparent to those of skill in the art upon reading the foregoing. For example, it may be possible to modify intensity, gradient, orientation, or other characteristics of the applied magnetic field to measure different properties of the sample under consideration. Such variations and applications are intended to within the scope and spirit of the invention as set forth in the following claims.

I claim:

1. A method for detecting in a sample the presence of a substance that is either paramagnetic, diamagnetic, or ferromagnetic, the method comprising
    (a) providing a first conductor in operative relation to the sample;
    (b) applying an electromagnetic signal to said first conductor, said signal not inducing any substantial physical or chemical change in the sample;
    (c) determining a baseline value of a performance characteristic of said first conductor while in operative relation to the sample and with the electromagnetic signal applied to said first conductor,
    (d) applying a magnetic field to the sample,
    (e) determining a measured value of a performance characteristic of said first conductor while in operative relation to the sample, and with the electromagnetic signal applied to the said first conductor and with the magnetic field applied to the sample; and
    (f) correlating the difference between the measured value of the performance characteristic and the baseline value of the performance characteristic to the presence of the substance to be detected.

2. The method of claim 1 further comprising measuring the performance characteristic of the first conductor more than once, and correlating changes in the measured values of the performance characteristic with changes in the sample of the amount of the substance to be detected.

3. The method of claim 1 wherein said correlation is quantitative.

4. The method of claim 1 wherein the sample is the blood of a living being in vivo.

5. The method of claim 4 wherein the sample is the blood in the finger of a human being, the finger being placed in operative relation to the first conductor.

6. The method of claim 1 wherein the performance characteristic of the conductor is selected from the group consisting of resistance, conductance, inductance, capacitance, and efficiency.

7. A method for detecting in a sample the presence of a substance that is either paramagnetic, diamagnetic, or ferromagnetic, the method comprising
   (a) providing a first conductor in operative relation to the sample;
   (b) applying an electromagnetic signal to said first conductor, said signal not inducing any substantial physical or chemical change in the sample;
   (c) determining a baseline value of a performance characteristic of said first conductor while in operative relation to the sample and with the electromagnetic signal applied to said first conductor,
   (d) applying a magnetic field to the sample,
   (e) determining a measured value of a performance characteristic of said first conductor while in operative relation to the sample, and with the electromagnetic signal applied to said first conductor and with the magnetic field applied to the sample;
   (f) repeating step (e) one or more times over a period of time, and
   wherein the sample is a resin undergoing a physical change of state and any change in the measured performance characteristic of the conductor indicates the progress of the change of physical state of the resin.

8. An apparatus for detecting in a sample the presence of a substance is either paramagnetic, diamagnetic, or ferromagnetic, the apparatus comprising
   a first conductor in operative relation to the sample;
   a means for applying an electromagnetic signal to said first conductor, said signal not inducing any substantial physical or chemical change in the sample;
   a means for applying a magnetic field to the sample; and
   a means for measuring a performance characteristic of said first electrical conductor while in operative relation to the sample and with the electromagnetic signal applied to said first conductor, the measured value of said performance characteristic being a function of the presence in the sample of the substance to be detected.

9. The apparatus of claim 8 wherein said means for applying a magnetic field to the sample is an electromagnet.

10. The apparatus of claim 8 wherein said means for applying a magnetic field to the sample is a permanent magnet assembly.

11. The apparatus of claim 8 further including a means to display the measured value of the performance characteristic.

12. The apparatus of claim 8 further including a data storage and analysis means for correlating the measured value of the performance characteristic to the presence in the sample of the substance to be detected.

13. An apparatus for detecting in a sample the presence of a substance that is either paramagnetic diamagnetic, or ferromagnetic, said apparatus comprising,
   a first conductor positionable in operative relation to the sample;
   a means for applying an electromagnetic signal to said first conductor, said signal not inducing any substantial physical or chemical change to the sample;
   a means for applying a magnetic field to the sample when the sample is in operative relation to said first conductor;
   a means for measuring a performance characteristic of said first electrical conductor;
   a second conductor positionable in operative relation to the sample;
   a means for applying an electromagnetic signal to said second conductor; and
   means for measuring a performance characteristic of said second conductor, whereby the measured value of the performance characteristic of said first conductor and the measured value of the performance characteristic of said second conductor can be correlated with the presence in the sample of the substance to be detected.

14. The apparatus of claim 13, further including a data storage and analysis means for receiving the measured values of the performance characteristics of said first and second conductors and correlating the values to the presence in the sample of the substance to be detected.

15. The apparatus of claim 13 wherein said means for applying an electromagnetic signal to said first conductor and said means for applying an electromagnetic signal to said second conductor are a single device.

16. The apparatus of claim 13 wherein said means for measuring a performance characteristic of said first conductor and said means for measuring a performance characteristic of said second conductor are a single device.

17. The method of claim 1 wherein said electromagnetic signal comprises an electromagnetic wave.

18. The method of claim 1 wherein said electromagnetic signal comprises AC current.

19. The method of claim 1 wherein the electromagnetic signal comprises DC current.

20. The method of claim 2 wherein the sample undergoes a reaction and the changes in the measured value of the performance characteristics indicates the progress of the reaction.

21. A method of detecting in a sample the presence of a substance that is either paramagnetic, diamagnetic, or ferromagnetic, the method comprising
   (a) providing a first conductor in operative relation to the sample;
   (b) applying an electromagnetic signal to said first conductor, said signal not inducing any substantial physical or chemical change in the sample,
   (c) applying a magnetic field to the sample;
   (d) determining a measured value of a performance characteristic of said first conductor while in operative relation to the sample, and with the electromagnetic signal applied to said first conductor and with the magnetic field applied to the sample;
   (e) repeating step (d) one or more times over a period of time; and
   (f) correlating any change in the measured value of the performance characteristic over time to a change in the amount of the substance to be detected.

22. The method of claim 21 wherein said electromagnetic signal comprises an electromagnetic wave.

23. The method of claim 21 wherein said electromagnetic signal comprises AC current.

24. The method of claim 21 wherein the electromagnetic signal comprises DC current.

25. The method of claim 21 wherein the sample undergoes a reaction and the changes in the measured value of the performance characteristics indicates the progress of the reaction.

26. The method of claim 21 wherein the sample undergoes a physical change of state and any change in the measured performance characteristics of the conductor indicates the progress of the change of the physical state of the sample.

27. The method of claim 21 wherein the sample is the blood of a living being in vivo.

28. The method of claim 21 wherein the sample is blood in the finger of a human being, the finger being place in operative relation to the first conductor.

29. The method of claim 21 wherein the performance characteristic of the conductor is selected from the group consisting of resistance, conductance, inductance, capacitance, and efficiency.

30. The method of claim 21 wherein the sample is a fluid flowing through a conduit and the correlated values correspond to changes in the composition of the fluid.

31. The method of claim 27 wherein the sample is blood in an organ of a human being.

32. A method for detecting in a sample the presence of a substance that is either paramagnetic, diamagnetic, or ferromagnetic, the method comprising
 (a) providing a first conductor in operative relation to the sample;
 (b) applying an electromagnetic signal to said first conductor, said signal not inducing any substantial physical or chemical change in the sample;
 (c) determining a baseline value of a performance characteristic of said first conductor while in operative relation to the sample and with the electromagnetic signal applied to said first conductor;
 (d) placing the sample in operative relation to a second conductor;
 (e) applying an electromagnetic signal to the second conductor, said signal not inducing any substantial physical or chemical change in the sample;
 (f) determining a baseline value of a performance characteristic of said second conductor while in operative relation to the sample;
 (g) applying a magnetic field to the sample;
 (h) determining a measured value of a performance characteristic of said second conductor while in operative relation to the sample, and with the magnetic field applied to the sample; and
 (i) correlating the differences between the baseline value of the performance characteristic of the first conductor, the baseline value of the performance characteristic of the second conductor, and the measured value of the performance characteristic of the second conductor to the presence of the substance to be detected.

33. The method of claim 32 wherein said performance characteristic is selected from the group consisting of resistance, conductance, inductance, capacitance, and efficiency.

34. The method of claim 32 wherein said electromagnetic signal comprises an electromagnetic wave.

35. The method of claim 32 wherein said electromagnetic signal comprises AC current.

36. The method of claim 32 wherein said electromagnetic signal comprises DC current.

37. The method of claim 32 wherein the sample is the blood of a living being in vivo.

38. The method of claim 37 wherein the sample is the blood in the finger of a human being, the finger being placed alternately in operative relation to the first conductor and the second conductor.

39. The method of claim 37 wherein the sample is the blood in an organ of a human being.

40. A method for detecting in a sample the presence of a substance that is either paramagnetic, diamagnetic, or ferromagnetic, the method comprising
 (a) providing a first conductor in operative relation to the sample;
 (b) applying an electromagnetic signal to said first conductor, said signal not inducing any substantial physical or chemical change in the sample;
 (c) determining a baseline value of a performance characteristic of said first conductor while in operative relation to the sample and with the electromagnetic signal applied to said first conductor;
 (d) placing the sample in operative relation to a second conductor;
 (e) applying an electromagnetic signal to the second conductor, said signal not inducing any substantial physical or chemical change in the sample;
 (f) determining a baseline value of a performance characteristic of said second conductor while in operative relation to the sample;
 (g) applying a magnetic field to the sample;
 (h) determining a measured value of a performance characteristic of said second conductor while in operative relation to the sample, and with the magnetic field applied to the sample;
 (i) repeating step (h) one or more times over a period of time; and
 (j) correlating any change in the measured value of the performance characteristic of the second conductor over time within a change in the amount of the substance to be detected.

41. The method of claim 40 wherein said performance characteristic is selected from the group consisting of resistance, conductance, inductance, capacitance, and efficiency.

42. The method of claim 40 wherein said electromagnetic signal comprises an electromagnetic wave.

43. The method of claim 40 wherein said electromagnetic signal comprises AC current.

44. The method of claim 40 wherein said electromagnetic signal comprises DC current.

45. The method of claim 40 wherein the sample is the blood of a living being in vivo.

46. The method of claim 45 wherein the sample is the blood in the finger of a human being.

47. The method of claim 45 wherein the sample is the blood in an organ of the human body.

48. The method of claim 40 wherein the sample undergoes a reaction and any changes in the measured value of the performance characteristics of the second conductor indicates the progress of the reaction.

49. The method of claim 40 wherein the sample undergoes a physical change of state and any change in the measured performance characteristic of the second conductor indicates the progress of the change of physical state of the sample.

50. The method of claim 40 wherein the sample is a fluid flowing through a conduit and the changes in the measured performance characteristic of the second conductor correspond to the changed in the composition of the fluid.

51. A method for detecting in a sample the presence of a substance that is either paramagnetic, diamagnetic, or ferromagnetic, the method comprising
 (a) providing a first conductor in operative relation to the sample;
 (b) applying an electromagnetic signal to said first conductor, said signal not inducing any substantial physical or chemical change in the sample;
 (c) determining a baseline value of a performance characteristic of said first conductor while in operative relation to the sample and with the electromagnetic signal applied thereto, (d) applying a magnetic field to the sample, (e) determining a measured value of a performance characteristic of said first conductor while in operative relation to the sample, and with the electromagnetic signal applied to said first conductor and with the magnetic field applied to the sample;

(f) repeating step (e) one or more times over a period of time, and wherein the sample is undergoing a physical change of state and any change in the measured performance characteristic of the conductor indicates the progress of the change of physical state of the sample.

52. A method for determining the crystal polarization of a sample comprising:

(a) providing a first conductor in operative relation to the sample;

(b) applying an electromagnetic signal to said first conductor, said signal not inducing any substantial physical or chemical change in the sample;

(c) determining a baseline value of a performance characteristic of said first conductor while in operative relation to the sample and with the electromagnetic signal applied to said first conductor, (d) applying a magnetic field to the sample, (e) determining a measured value of a performance characteristic of said first conductor while in operative relation to the sample, and with the electromagnetic signal applied to the said first conductor and with the magnetic field applied to the sample, (f) changing the orientation of the axis of the magnetic field and the orientation of the sample with respect to one another, (g) determining a measured value of a performance characteristic of said first conductor while in operative relation to said sample, and with the magnetic field applied to the sample in said changed orientation with respect to one another, (h) correlating the difference between the values of the performance characteristic as measured in step (e) and step (g) with the crystal polarization of the sample.

53. The method of claim 2 wherein the sample is a fluid flowing through a conduit and the correlated values correspond to changes in the composition of the fluid.

* * * * *